United States Patent [19]

Pfaff

[11] Patent Number: 4,829,284

[45] Date of Patent: May 9, 1989

[54] PROCEDURE FOR MONITORING OF AN OBJECT USING A SIGNAL LINE, TOGETHER WITH A PULSE MEASURING APPARATUS TO CARRY OUT THIS PROCEDURE

[75] Inventor: Helmut Pfaff, Hausach, Fed. Rep. of Germany

[73] Assignee: Seba-Dynatronic Messund Ortungstechnik GmbH, Baunach, Fed. Rep. of Germany

[21] Appl. No.: 228,875

[22] Filed: Aug. 5, 1988

Related U.S. Application Data

[63] Continuation of Ser. No. 909,480, Sep. 19, 1986, abandoned.

[30] Foreign Application Priority Data

Sep. 19, 1985 [DE] Fed. Rep. of Germany ....... 3533479

[51] Int. Cl.4 .................... G08B 25/00; G01R 19/00
[52] U.S. Cl. .................................. 340/524; 340/505; 324/66; 324/534
[58] Field of Search ............... 340/524, 564, 531, 505; 324/51, 52, 58 B, 58.5 B, 66

[56] References Cited

U.S. PATENT DOCUMENTS

| | | | |
|---|---|---|---|
| 3,031,643 | 4/1962 | Sheftelman | 340/564 |
| 3,707,709 | 12/1972 | Wolf et al. | 340/564 |
| 3,732,562 | 5/1973 | Faber et al. | 340/505 |
| 4,327,358 | 4/1982 | Karas | 340/564 |
| 4,423,410 | 12/1983 | Galvin et al. | 340/505 |
| 4,450,434 | 5/1984 | Nielson et al. | 340/550 |
| 4,571,578 | 2/1986 | Karas | 340/564 |

Primary Examiner—Donnie L. Crosland
Attorney, Agent, or Firm—Fleit, Jacobson, Cohn & Price

[57] ABSTRACT

A multitude of alarm indicators are layed out in a signal line for the purpose of monitoring an extensive object. Such an object can be a large building, a pipeline or similar device. In order to determine which of the alarm indicators has triggered off the alarm, a repeated pulse is fed into the signal line whose echo is compared with a programmed-in echo signal. The programmed echo signal is acquired through the transmission of a pulse when all of the alarm indicators are out of service. By comparison of the programmed-in echo signal with the measured echo signal, the distance of the activated alarm indicator from the beginning of the signal line can be measured.

3 Claims, 1 Drawing Sheet

PROCEDURE FOR MONITORING OF AN OBJECT USING A SIGNAL LINE, TOGETHER WITH A PULSE MEASURING APPARATUS TO CARRY OUT THIS PROCEDURE

This application is a continuation of application Ser. No. 909,480, filed Sept. 19, 1986 now abandoned.

BACKGROUND OF THE INVENTION

The invention concerns a procedure for the monitoring of an object using an electric signal line installed in the area of the object, whose electrical state changes in the event of a disturbance, thereby setting off an alarm.

It is known for example that many kinds of objects are monitored and secured by the above features, that a signal line which is continually electrified is installed around an object, for example, a building which is to be secured. If the alarm circuit is broken, the alarm signal is triggered by the sudden voltage change.

This known procedure has the disadvantage in that the location of the disturbance is not known. This information is however, vital, particularly if the monitored object is very long or of a large area, for example pipelines, buried gas pipes and so on.

BRIEF SUMMARY OF THE INVENTION

The invention takes as its basis, therefore, to propose a procedure by means of which objects such as those having excessive length can be securely monitored.

To meet this requirement the invention is characterized in that a pulse is repeatedly fed into the signal line whose echo is compared with that of a programmed-in echo signal in which the alarm signal is triggered by the presence of a value greater than that of a specific value between the two echo signals.

By this method it is possible to measure the distance between the location of the disturbance and the control point using the known speed of propagation of the pulse in the line together with the time duration of the pulse from its transmission to the receiving of the returned signal pulse. This can all be achieved in a computerized pulse measuring apparatus, which instantly indicates the distance of the disturbance from the control point while simultaneously triggering off the alarm signal. The security personnel then immediately know the location of the disturbance, the location of which is given as an input, for example to a pulse plotter from which it can be read off.

It is also possible to feed in the pulse from both ends of the signal line to achieve a greater margin of safety. This also applies to a signal line installed in a loop in which the echo is fed in both directions which echos are measured after the described fashion.

An important refinement to the invention is characterized in that several alarm indicators are installed along the length of the signal line which signal in the event of a disturbance. The alarm indicators have specific sensors which are actuated in the event of a disturbance and transmit the disturbance signal to the control point. The disturbance signal has in this case, a particularly large amplitude and is received very clearly. These refinements of the invention create therefore, a very reliable measurement of the distance between the location of the disturbance and the control point.

The pulse measuring apparatus according to the invention, is computerized, preferably digital. It is so developed that it generates the repeated test pulse, preferably at periodic intervals, and records the received pulse. The measuring apparatus compares the echo pulse with an already programmed-in picture of the undisturbed measurement section and effects the described comparison. It automatically gives the alarm signal as soon as a disturbance occurs and indicates at the same time the distance between the location of the disturbance and the control point.

Areas of application suggested are for example the monitoring of pipelines where the signal line is laid parallel to the pipeline; the monitoring of gas pipes; electrical cables such as telephone cables and the like which are to be protected against tapping; and so on. Here the principle of the invention applies in that in the case of tapping of a telephone line its impedance alters at the point of the tap and this local impedance alteration reflects the signal fed into the cable.

The mentioned signal line can therefore be the telephone line itself, an electric power supply and so on. The cable can be either single or multi-core. Further examples of application are the monitoring of underground cables or circuits which are damaged either deliberatley or accidentally during excavation work. Here again the location of the damage, that is, the disturbance,is, by the described principle immediately registered. Further examples are signal circuits which, due to seepage of oil or petrol, alter their characteristic impedance in lumps and their localized changes of impedance create the reflected pulse signal which is evaluated in the described fashion.

BRIEF DESCRIPTION OF THE DRAWINGS

The invention is further explained by use of layout examples from which arise further important features.

Illustrations.

DETAILED DESCRIPTION

Figure 1:
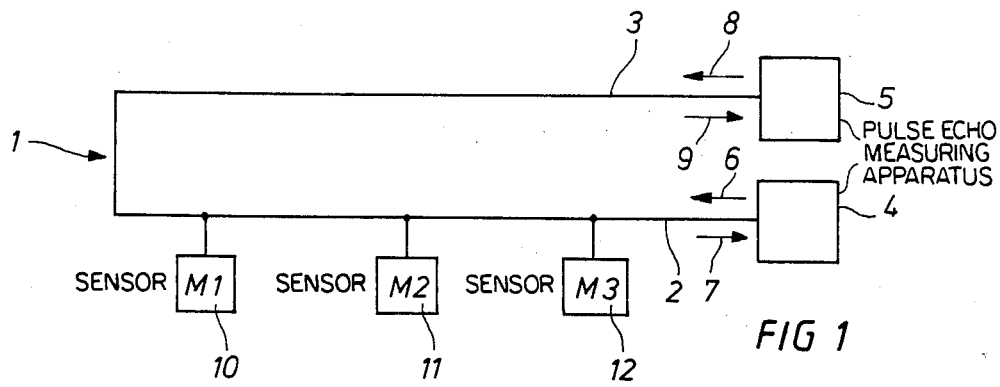
FIG. 1. A switching circuit to explain the fundamental method of operation of the procedure according to the invention.

A signal line(1) is shown in FIG. 1 in schematic form from where this signal line generally consists of a 2-wire lead either of two parallel wires or a co-axial cable.

In the present case, the co-axial layout is preferred as in this way characteristic impedances can be measured under particular low-loss conditions, which means that long signal lines can be readily monitored.

In the illustrated layout example according to FIG. 1 it is sufficient if the signal line(1) consists of a one-way conductor on which several indicators(10)(11)(12) are arranged in parallel. At the start of the signal line(1) cable, a pulse echo measuring apparatus(4) is situated which transmits a continuous pulse to the signal line in the direction of arrow(6). The pulse is either reflected by the end of the signal line or, in the case of a disturbance by the specific activated indicator in the direction of arrow(7) and is received by the pulse echo measuring apparatus(4) and processed (M1, M2 and M3). The indicators are fitted with specific sensors. By means of a simple measurement of time duration between the transmitted signal in direction of arrow(6) and the received signal in direction of arrow(7) the indicator activated by the disturbance can be established. In the shown layout example it is the indicator(10) which has changed the specific electrical parameters of the one-way conductor(2). It is also possible here, for example, that the one-way conductor, formed here by a coaxial cable, is short circuited with the other wire.

In an extension of the layout example according to FIG. 1, it is intended that the cable end is also measured so that, in the case of a disturbance the signal line(1) can be surveyed from both the start and the end of the cable. For this purpose a return circuit(3) is led back to the start of the cable and a pulse echo measuring apparatus is also connected to it which creates a pulse signal in the direction of arrow(8) and which receives a specific reflected signal in arrow direction(9).

This form of layout has the advantage, in that if, for example, indicator(11) operates, the exact location of indicator(11) in the signal line(1) can be calculated by the pulse echo measuring apparatus(4), and by the measurement from pulse echo measuring apparatus(5) it can be established if indicator(10) has also been activated or not.

Figure 2:
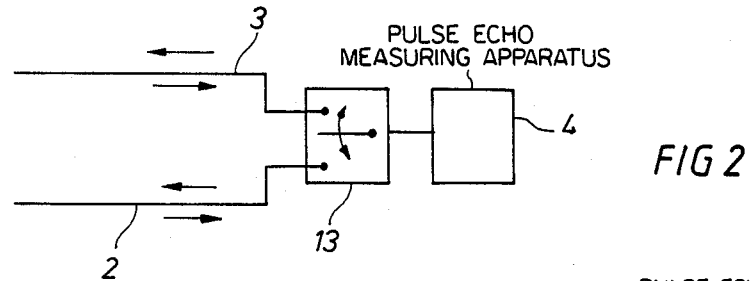
FIG. 2. A modification of FIG. 1.

In a simplified form of layout, illustrated by FIG. 2 it is shown that two pulse echo measuring apparatus do not have to be used, rather that it is sufficient to use a single pulse echo measuring apparatus for the measurement between the start and the end of the cable whereby a selector switch(13) switches between the one-way conductor(2) and the return circuit(3).

Figure 3:
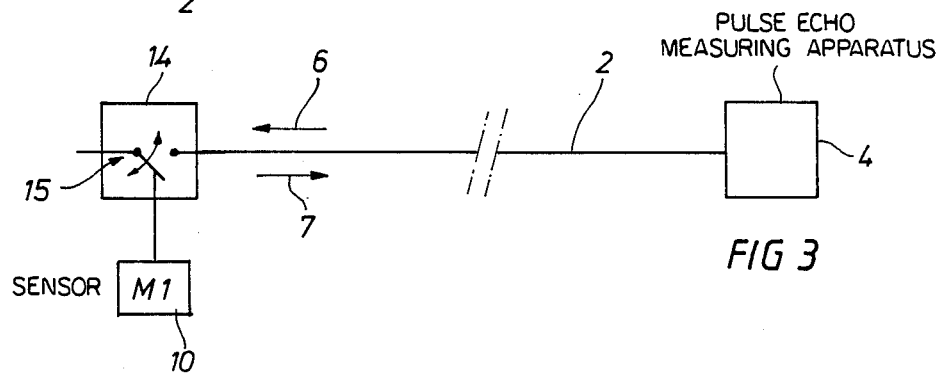
FIG. 3. The details of the circuit design according to FIGS. 1 or 2.

FIG. 3 shows the possible layout of a junction(14) in connection with indicator(10). In this layout example, a junction(14) is formed as a circuit breaker(15) whereby the circuit breaker is activated in the case of an alarm by indicator(10). In the case of an alarm then, the circuit breaker(15) is controlled and opens the one-way conductor(2) through which the direct current resistance of the one-way conductor(2) is altered.

The disturbance point so created leads to a strong reflection in the direction of arrow(6) of the pulse signal fed into the circuit, so that the pulse echo measuring apparatus(4) can determine the exact location of the indicator(10) in the signal line(1) quite simply.

Figure 4:
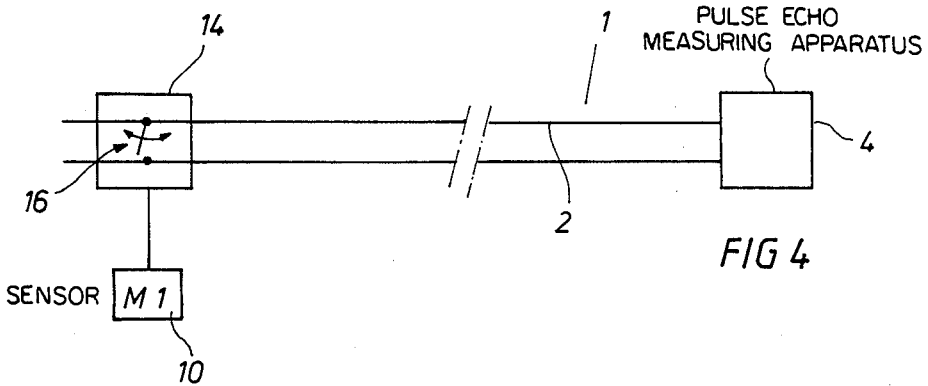
FIG. 4. A circuit design similar to FIG. 3., again of a modified type.

In the layout example shown in FIG. 4 the junction(14) is formed as a circuit maker, whereby in the case of an alarm,the indicator(10) operates the circuit maker(16) in such a way that a short circuit is created in the two-core signal line which again alters an electrical parameter of the signal line. By means of the time duration the location of the affected indicator(10) along the length of the signal line(1) can be established.

In a further layout example, not further illustrated, it can be forseen that instead of the short circuit or the opening of signal line(1), a specifically defined characteristic impedance is switched into the line from an indicator in the case of an alarm.

The pulse echo measuring apparatus(4) is computer controlled and connected to a computer in such a way that the computer immediately identifies the activated indicator on a monitor screen or similar.

Therefore,no further conversion of the measured time duration in connection with the location of the indicator is required in that this data can be programmed into the receiving station and immediately displayed on a monitor screen or similar.

I claim:

1. A method for monitoring the integrity of an elongated device comprising the steps of: establishing a signal path in coextensive relationship with said elongated device; sensing a disturbance in said elongated device at one of a plurality of spaced locations along said signal path causing a change in impedance characteristics of said signal path at the respective locations; applying test signal pulses to a control point on said signal path independently of any echo pulses reflected from one of said spaced locations in response to said sensing of the disturbance; storing data representative of pulse transit time of the echo pulses between said control point and the spaced locations along the signal path when unperturbed; and comparing the pulse transit time of said reflected echo pulses from said one of the spaced locations to said control point with the stored data of the unperturbed signal path to produce an alarm signal indicative of said disturbance in the elongated device at said one of the spaced locations.

2. The method of claim 1, further comprising the steps of measuring the pulse transit time of the reflected echo pulses from said one of said spaced locations to said control point for comparison with the stored data to indicate distance of the disturbance from said control point.

3. The method of claim 1, wherein said test signal pulses are generated and applied to both ends of the signal path.

* * * * *